US005583293A

United States Patent [19]

Flögel

[11] Patent Number: 5,583,293

[45] Date of Patent: Dec. 10, 1996

[54] SONIC OR ULTRASONIC TRANSDUCER

[75] Inventor: Karl Flögel, Schopfheim, Germany

[73] Assignee: Endress + Hauser GmbH + Co., Maulburg, Germany

[21] Appl. No.: 244,595

[22] PCT Filed: Sep. 24, 1993

[86] PCT No.: PCT/EP93/02605

§ 371 Date: Jun. 1, 1994

§ 102(e) Date: Jun. 1, 1994

[87] PCT Pub. No.: WO94/07615

PCT Pub. Date: Apr. 14, 1994

[30] Foreign Application Priority Data

Oct. 2, 1992 [DE] Germany .......................... 42 33 256.7

[51] Int. Cl.[6] .................................................... H01L 41/08

[52] U.S. Cl. ............................ 73/642; 310/328; 310/369

[58] Field of Search .................................... 310/328, 322, 310/369, 337; 73/632, 642

[56] References Cited

U.S. PATENT DOCUMENTS

| | | | |
|---|---|---|---|
| 1,865,858 | 7/1932 | Hund | 310/369 |
| 2,808,524 | 10/1957 | Feinstein | 310/369 |
| 3,571,632 | 3/1971 | Tong | 310/369 |
| 4,400,641 | 8/1983 | Vishnevsky | 310/323 |
| 4,611,372 | 9/1986 | Enjoji et al. | 310/327 |
| 4,868,446 | 9/1989 | Kumada | 310/323 |
| 5,278,471 | 1/1994 | Uehara et al. | 310/328 |
| 5,343,109 | 8/1994 | Möckl | 310/334 |

*Primary Examiner*—Hezron E. Williams
*Assistant Examiner*—Rose M. Finley
*Attorney, Agent, or Firm*—Bose McKinney & Evans

[57] ABSTRACT

The sonic or ultrasonic transducer includes a circular piezo-ceramic disk capable of generating radial oscillations, and a metal ring, which embraces in tight close fitting relationship the circumferential surface area of the disk to form a radial oscillator in conjunction with the disk. The sonic or ultrasonic transducer formed in this manner has an emission surface corresponding to the entire surface area of the piezo-ceramic disk and metal ring, and displays a radial resonant frequency which is lower than that of the piezo-ceramic disk.

11 Claims, 2 Drawing Sheets

SONIC OR ULTRASONIC TRANSDUCER

This invention relates to a sonic or ultrasonic transducer which includes a circular piezo-ceramic disk capable of generating oscillations, and a metal ring, surrounding the piezo-ceramic disk.

The operating frequency of a sonic or ultrasonic transducer which includes a piezo-ceramic disk capable of generating radial oscillations generally corresponds to the radial resonant frequency of the piezo-ceramic disk, which is dictated by the dimensions of the piezo-ceramic disk. The diameter of the piezo-ceramic disk further determines the magnitude of the sonic emission surface, which determines the apex angle of the produced sonic radiation. In an ultrasonic transducer of the nature set out above known from DE-PS 25 41 492, a foam plate having a substantially larger surface area than the piezo-ceramic disk is adhesively bonded to an end face of the piezo-ceramic disk, to serve as an adaptive layer for reducing the apex angle dictated by the dimensions of the piezo-ceramic disk. The protruding region of the foam plate is connected to the metal ring surrounding the piezo-ceramic disk which serves as a weighting ring and in order for the interface between the weighting ring and the piezo-ceramic disk to constitute a nodal surface which remains virtually immobile during the operation of the ultrasonic transducer. In this way the entire exposed end face of the adaptive layer is caused to oscillate virtually in phase with the piezo-ceramic disk. The metal ring may not touch the piezo-ceramic disk in order to fulfill this function as a weighting ring. Although the sonic emission area of this prior art ultrasonic transducer is increased in relation to the surface area of the piezo-ceramic disk, the operating frequency remains dependent on the diameter of the piezo-ceramic disk. A reduction in the operating frequency is only attainable by using a larger piezo-ceramic disk.

The object of the present invention is the provision of a sonic or ultrasonic transducer of the nature set out above, which for a given set of dimensions of the piezo-ceramic disk produces a lower operating frequency in relation to the radial resonant frequency of the piezo-ceramic disk.

This object is met according to the invention in that the metal ring embraces in tight close fitting relationship the circumferential surface area of the piezo-ceramic disk to form a radial oscillator in conjunction with the disk.

In a sonic or ultrasonic transducer according to the invention the metal ring is firmly coupled to the piezo-ceramic disk so that both components constitute a mass-spring element performing radial oscillations in unison. The entire surface area of the radial oscillator formed in this manner functions as an emitting surface oscillating completely in phase, producing a substantially Gaussian distribution of amplitudes, the sonic emission thereby displaying a small apex angle without interfering secondary lobes. The radial resonant frequency of this radial oscillator is lower, however, than the radial resonant frequency of the piezo-ceramic disk. More particularly it is dependent on the dimensions of the metal ring. It is accordingly feasible to manufacture sonic or ultrasonic transducers for different operating frequencies by means of identical piezo-ceramic disks by appropriately dimensioning the metal ring.

The metal ring is preferably connected to the piezo-ceramic disk by being shrunk on.

An adaptive layer may be applied in known fashion onto the one end face of the radial oscillator formed by the piezo-ceramic disk and the metal ring.

Further features and advantages of the invention will be apparent from the following description of an embodiment with reference to the drawings. In the drawings.

Figure 1:
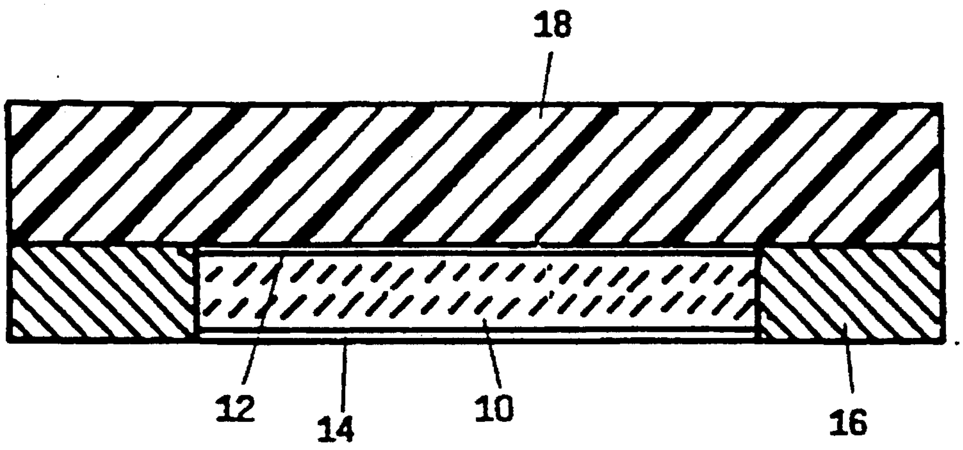
FIG. 1 shows a sonic or ultrasonic transducer according to the invention.

The sonic or ultrasonic transducer shown in FIG. 1 includes a circular piezo-ceramic disk 10 having metal electrodes 12, 14 applied to both of its end faces. The piezo-ceramic disk 10 is surrounded by a metal ring 16 which is arranged in tight close fitting relationship with the circumferential surface of the piezo-ceramic disk. The metal ring 16 may be connected to the piezo-ceramic disk 10 by having been shrunk on for example, i.e. the ring is applied around the piezo-ceramic disk in a heated state, and firmly encircles it after cooling. The metal ring 16 may be of aluminium, for example.

Whenever an alternating current is applied to the electrodes 12 and 14 the piezo-ceramic disk 10 is excited to produce radial oscillations. As a result of the intimate coupling with the metal ring 16 these radial oscillations are transferred to the metal ring whereby the entire assembly functions as a single radial oscillator. In order to ensure that the sonic or ultrasonic wave is emitted substantially to one side only an adaptive layer 18 having a thickness corresponding to a quarter of the wave length of the sonic or ultrasonic wave produced is applied to that one end face of the piezo-ceramic disk 10 and the metal ring 16.

Figure 2:
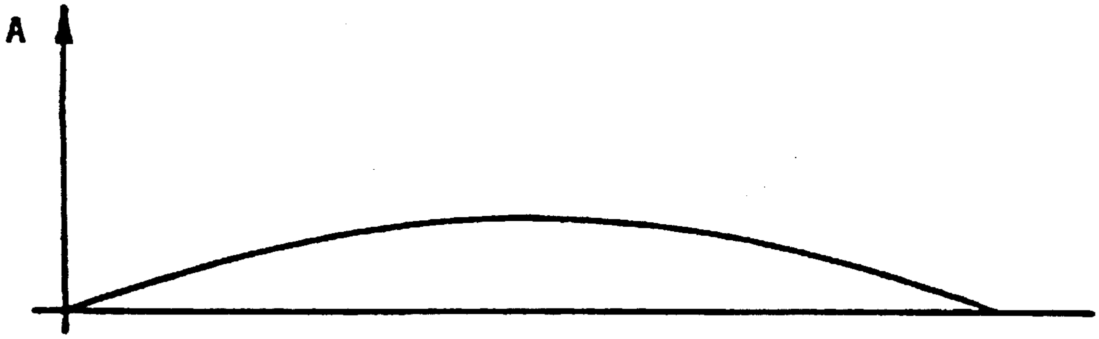
FIG. 2 shows the amplitude distribution over the emitting surface of the sonic or ultrasonic transducer of FIG. 1.

FIG. 2 shows the amplitude distribution of the oscillations across the entire surface area of the radial oscillator comprising the piezo-ceramic disk 10 and the metal ring 16. The amplitude distribution complies substantially with the desired Gaussian distribution. The oscillations are in phase across the entire surface area so that a radiation diagram without interfering secondary lobes is obtained, having an apex angle determined by the overall surface area of the radial oscillator.

Figure 3:
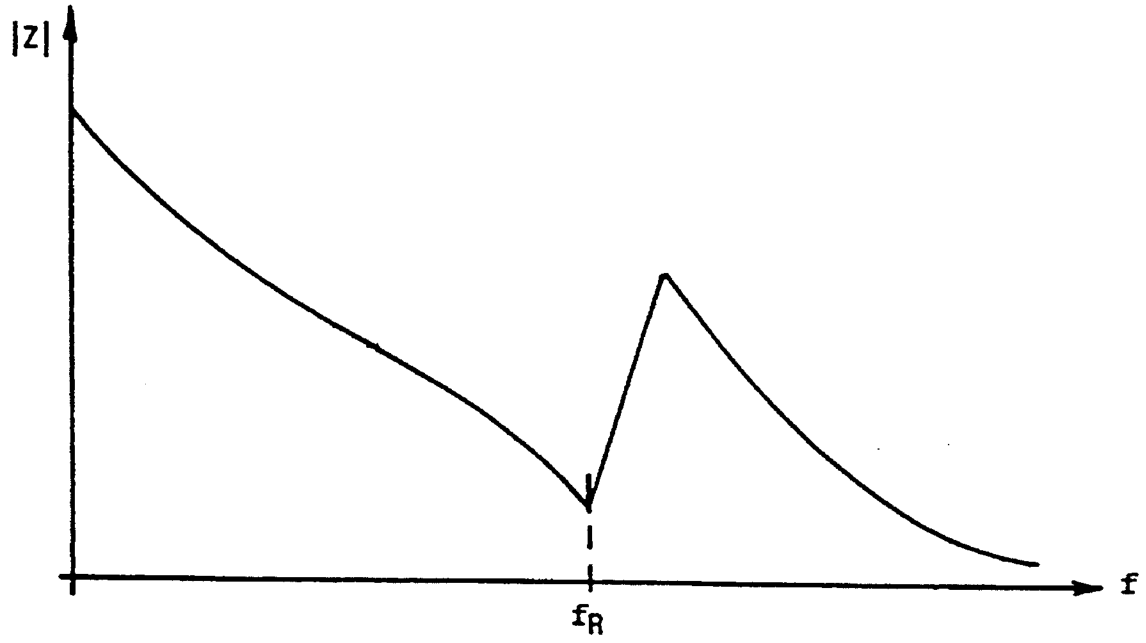
FIG. 3 shows the characteristic frequency curve of the piezo-ceramic disk of the sonic or ultrasonic transducer of FIG. 1.
Figure 4:
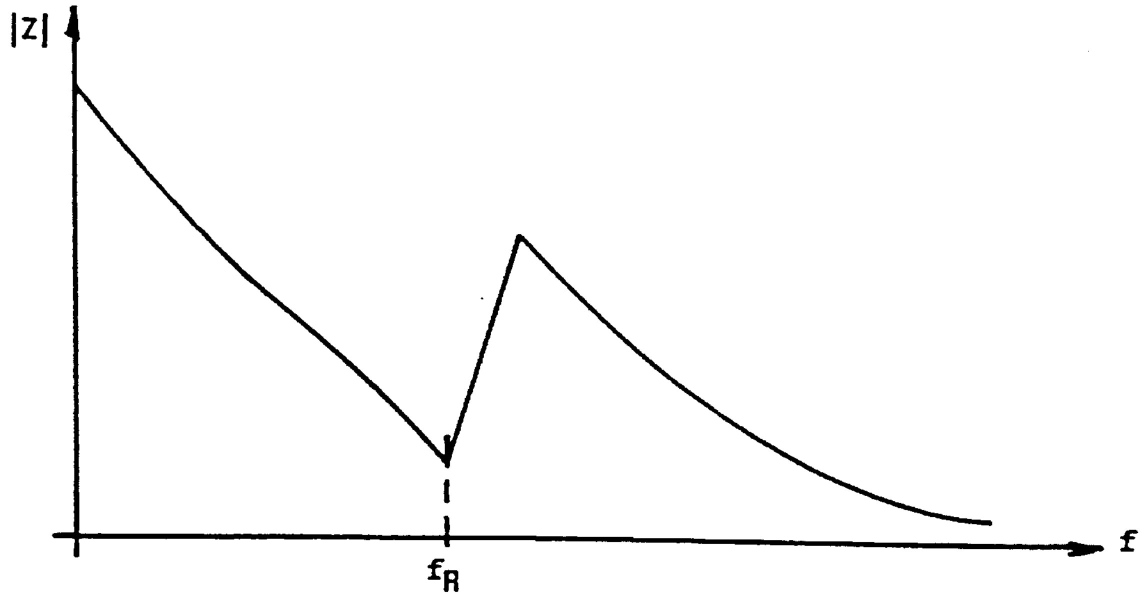
FIG. 4 shows the characteristic frequency curve of the entire sonic or ultrasonic transducer of FIG. 1.

FIG. 3 shows the frequency characteristic curve for the piezo-ceramic disk 10 in which the radial resonant frequency is denoted as $f_R$. FIG. 4 shows on the same scale the frequency characteristic curve for the radial oscillator formed by the piezo-ceramic disk 10 and the metal ring 16. It is evident that this radial oscillator has substantially the same frequency characteristics as the piezo-ceramic disk 10 whereas the radial resonance frequency is substantially lower; the latter lies intermediate between the radial resonance frequency of the piezo-ceramic disk 10 and the radial resonance frequency of the metal ring 16. It is accordingly feasible to obtain a desired reduced radial resonance frequency by means of the same piezo-ceramic disk 10 by appropriately dimensioning the metal ring 16.

The diagrams of FIGS. 2, 3 and 4 make it clear that the radial oscillator comprising the piezo-ceramic disk 10 and the metal ring 16 with regard to amplitude distribution, phase distribution and frequency, operates in the same manner as a piezo-ceramic disk having a larger diameter than the piezo-ceramic disk 10.

I claim:

1. A sonic or ultrasonic transducer comprising a circular piezo-ceramic disk capable of generating radial oscillations and having a circumferential surface, and a metal ring surrounding the piezo-ceramic disk, wherein the metal ring embraces in tight close fitting relationship the circumferential surface of the piezo-ceramic disk to form a radial oscillator in conjunction with the piezo-ceramic disk.

2. The sonic or ultrasonic transducer of claim 1, wherein the metal ring is secured to the piezo-ceramic disk by shrinking the metal ring.

3. The sonic or ultrasonic transducer of claim 1, wherein the metal ring is composed of aluminum.

4. The sonic or ultrasonic transducer of claim 1, wherein the radial oscillator includes one end face and further comprising an adaptive layer applied onto the one end face of the radial oscillator formed by the piezo-ceramic disk and the metal ring.

5. The sonic or ultrasonic transducer of claim 2, wherein the metal ring is composed of aluminum.

6. The sonic or ultrasonic transducer of claim 2, wherein the radial oscillator includes a first end face and a second end face and further comprising an adaptive layer applied onto the first end face of the radial oscillator.

7. The sonic or ultrasonic transducer of claim 3, wherein the radial oscillator includes a first end face and a second end face and further comprising an adaptive layer applied onto the first end face of the radial oscillator.

8. A sonic or ultrasonic transducer comprising a piezo-ceramic disk capable of generating radial oscillations and having a disk radial resonant frequency and a circumferential surface, and a metal ring surrounding the piezo-ceramic disk, wherein the metal ring and the piezo-ceramic disk form a radial oscillator having an oscillator radial resonant frequency which is lower than the disk radial resonant frequency.

9. The sonic or ultrasonic transducer of claim 8, wherein the radial oscillator has an oscillator diameter and the oscillator radial resonant frequency is lower than a radial resonant frequency of a second piezo-ceramic disk having a diameter equal to the oscillator diameter.

10. The sonic or ultrasonic transducer of claim 8, wherein the oscillator radial resonant frequency is a zero-order resonant frequency.

11. The sonic or ultrasonic transducer of claim 8, wherein the piezo-ceramic disk includes a first end face and a second end face and further comprising a first electrode situated on the first end face, a second electrode situated on the second end face, and means for providing an alternating current to the first and second electrodes to excite the piezo-ceramic disk and oscillate the radial oscillator so that the oscillations have a Gaussian amplitude distribution.

* * * * *